(12) United States Patent
deVilliers

(10) Patent No.: US 10,946,411 B2
(45) Date of Patent: Mar. 16, 2021

(54) SYSTEM AND METHOD FOR FLUID DISPENSE AND COVERAGE CONTROL

(71) Applicant: Tokyo Electron Limited, Tokyo (JP)

(72) Inventor: Anton J. deVilliers, Clifton Park, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/247,780

(22) Filed: Jan. 15, 2019

(65) Prior Publication Data

US 2019/0217328 A1 Jul. 18, 2019

Related U.S. Application Data

(60) Provisional application No. 62/617,345, filed on Jan. 15, 2018.

(51) Int. Cl.
| | |
|---|---|
| H01L 21/00 | (2006.01) |
| H01L 21/66 | (2006.01) |
| H04N 5/232 | (2006.01) |
| H04N 5/225 | (2006.01) |
| B05C 11/10 | (2006.01) |

(Continued)

(52) U.S. Cl.
CPC ........ B05C 11/1007 (2013.01); B05B 12/084 (2013.01); B05B 12/087 (2013.01); B05C 11/1005 (2013.01); B05C 13/025 (2013.01); H01L 22/26 (2013.01); H04N 5/2256 (2013.01);
(Continued)

(58) Field of Classification Search
CPC ..... H01L 22/12; H01L 22/26; B05C 11/1005; B05C 11/1007; B05C 13/02; B05C 13/025; H04N 5/2256; H04N 5/23229
See application file for complete search history.

(56) References Cited

U.S. PATENT DOCUMENTS

| | | | | |
|---|---|---|---|---|
| 5,043,904 A | * | 8/1991 | Sikes | B41F 13/025 101/248 |
| 2003/0012868 A1 | | 1/2003 | Davlin et al. | |

(Continued)

FOREIGN PATENT DOCUMENTS

| | | | | |
|---|---|---|---|---|
| JP | 2000-50286 | * | 2/2000 | H04N 9/735 |
| KR | 101130208 B1 | * | 3/2012 | G02F 1/1335 |

OTHER PUBLICATIONS

International Preliminary Report on Patentability and Written Opinion, dated Jul. 30, 2020, in International Application No. PCT/US2019/013588, filed Jan. 15, 2019, 17 pages.

*Primary Examiner* — Caridad Everhart

(74) *Attorney, Agent, or Firm* — Oblon, McClelland, Maier & Neustadt, L.L.P.

(57) ABSTRACT

Techniques herein include systems and methods for dispensing liquids on a substrate with real-time coverage control and removal control. Techniques also encompass quality control of dispense systems. Systems and methods enable visual examination of liquids progressing on a surface of a substrate. This includes capturing and/or examining stroboscopic images of movement of a given liquid on a working surface of a substrate, and then generating feedback data for modifying a corresponding dispense. Dispenses can be modified by increasing/decreasing a dispense rate and increasing/decreasing a rotational velocity of a substrate. Feedback can be generated by automated and/or manual analysis of real time progression as well as post-process analysis of collections of images.

6 Claims, 6 Drawing Sheets

(51) Int. Cl.
  *B05B 12/08*   (2006.01)
  *B05C 13/02*   (2006.01)
(52) U.S. Cl.
  CPC ......... *H04N 5/23229* (2013.01); *B05C 13/02* (2013.01); *H01L 22/12* (2013.01)

(56) References Cited

U.S. PATENT DOCUMENTS

| | | | |
|---|---|---|---|
| 2004/0036731 A1* | 2/2004 | Ready | H01L 21/288 347/19 |
| 2004/0261700 A1* | 12/2004 | Edwards | B25B 11/005 118/679 |
| 2007/0289530 A1* | 12/2007 | Kataho | B82Y 40/00 118/699 |
| 2013/0089664 A1* | 4/2013 | Inagaki | H01L 21/6715 427/240 |
| 2016/0379900 A1 | 12/2016 | Maehr et al. | |
| 2018/0036767 A1* | 2/2018 | Harumoto | B05D 1/005 |
| 2019/0001665 A1* | 1/2019 | Hurst | B41J 2/04536 |
| 2020/0147966 A1* | 5/2020 | Bertoni | C09D 11/52 |

\* cited by examiner

SYSTEM AND METHOD FOR FLUID DISPENSE AND COVERAGE CONTROL

CROSS REFERENCE TO RELATED APPLICATIONS

The present application claims the benefit of U.S. Provisional Patent Application No. 62/617,345, filed on Jan. 15, 2018, entitled "System and Method for Fluid Dispense and Coverage Control," which is incorporated herein by reference in its entirety.

BACKGROUND OF THE INVENTION

The present disclosure relates to semiconductor manufacturing and particularly to dispensing materials on a substrate.

Semiconductor manufacturing includes several processing steps that involve depositing liquid or fluid on a substrate. These processing steps include, among others, coating a wafer, developing a latent pattern, etching material on a wafer, and cleaning/rinsing a wafer.

In a routine microfabrication process, a thin layer of light-sensitive material, such as photoresist, is coated on a working surface (upper surface) of a substrate. The light-sensitive material is subsequently patterned via photolithography to define a mask pattern for transferring to an underlying layer by etching by using the patterned resist as an etch mask. Patterning of the light-sensitive material generally involves steps of coating, exposure, and development. A working surface of the substrate is coated with a thin film of light-sensitive material. The thin film of light-sensitive material is exposed to a radiation source through a reticle (and associated optics) using, for example, a micro-lithography system. Patterned exposure is followed by a development process during which the removal of soluble regions of the light-sensitive material occurs using a developing solvent. Soluble regions could be irradiated or non-irradiated regions depending on a tone of photoresist and developer used.

During the coating process, a substrate is positioned on a substrate holder and is rotated at high speed while resist solution is dispensed on an upper surface of the substrate. High rotation speeds can be several thousand or tens of thousands of revolutions per minute (rpm). When, for example, the resist solution is dispensed at the center of the substrate, the resist solution spreads radially across the substrate due to centrifugal forces imposed by the substrate rotation. Wet etch and cleaning processes can be similarly executed. In a development process, a solvent developer is deposited on a substrate that is rotated at a high speed. The solvent developer dissolves soluble portions of the photoresist, and then the developer and dissolved photoresist are removed radially across the substrate due to centrifugal forces. Wet etch processes, cleaning process, and rinsing processes are executed similarly to a development process in that a liquid is deposited on a rotating wafer and removed by centrifugal forces to clear or clean off a particular material or residue.

SUMMARY

During a given dispense process (such as coating, developing, etching, cleaning, et cetera) it is typical for more material to be dispensed than what is needed to complete the given process. In other words, instead of dispensing a minimum amount of liquid for a given process, and excess of material is dispensed. For example, in the context of coating a substrate with photoresist, an excess of photoresist is typically deposited to make sure that an entire surface of the substrate is fully coated or covered. There are various factors that affect how much photoresist is needed to achieve full coverage. To account for the variables affecting full coverage, an additional volume (known as "safety stock") is deposited just to make sure there is full coverage. This safety stock can be anywhere from 2-10 times more than a minimum volume needed for full coverage.

As can be appreciated, the extra safety stock used represents wasted material. This extra material dispensed can have an environmental impact as various chemicals need to be properly handled and disposed of after leaving the edge of the substrate. Reducing liquid used to a minimum necessary for full coverage (or full development, cleaning, et cetera) can result in reduced environmental impact and thus can be desirable to manufacturers. Certain spin-deposited chemicals can also be economically expensive and so reducing an amount of material dispensed for each operation can reduce cost of materials, which can also have some beneficial utility.

Techniques herein include systems and methods for dispensing liquids on a substrate with real-time coverage and progression control. Systems herein include a substrate holder configured to hold a substrate and rotate the substrate about an axis. A dispense unit is configured to dispense liquid on a working surface of the substrate while the substrate is being rotated on the substrate holder. A camera is positioned to capture images of the working surface of the substrate while the substrate is being rotated. A processor is configured to present or examine stroboscopic images received from the camera of a liquid on the working surface of the substrate. The processor is configured to generate feedback data while the substrate is rotating with the liquid thereon. A system controller is included that is connected to the substrate holder and connected to the dispense unit. The system controller is configured to adjust a volume of the liquid dispensed onto the working surface of the substrate based on feedback data while the substrate is rotating with the liquid thereon. The system controller can optionally execute other adjustments such as increasing or decreasing substrate rotation speed.

Processes herein include methods for dispensing liquid on a substrate. Example embodiments include rotating a substrate on a substrate holder about an axis. Dispensing a liquid on a working surface of the substrate. Capturing images of the working surface of the substrate while the liquid is on the working surface of the substrate. Examining stroboscopic images of movement of the liquid on the working surface of the substrate using an image processor. Generating feedback data based on examination of the stroboscopic images while the substrate is being rotated. And adjusting a dispense operation of the liquid on the working surface of the substrate based on the feedback data. The dispense operation corresponds to examined stroboscopic images. Such adjustments can include increasing/decreasing a volume of fluid dispensed, and/or increasing or decreasing a rotational velocity of the substrate holder. Accordingly, a given liquid on a rotating substrate can be optically/graphically evaluated in real-time with modifications to a corresponding dispense operation made in real-time as well. This can improve coating or removal processes, reduce material consumption, and increase yield and throughput.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
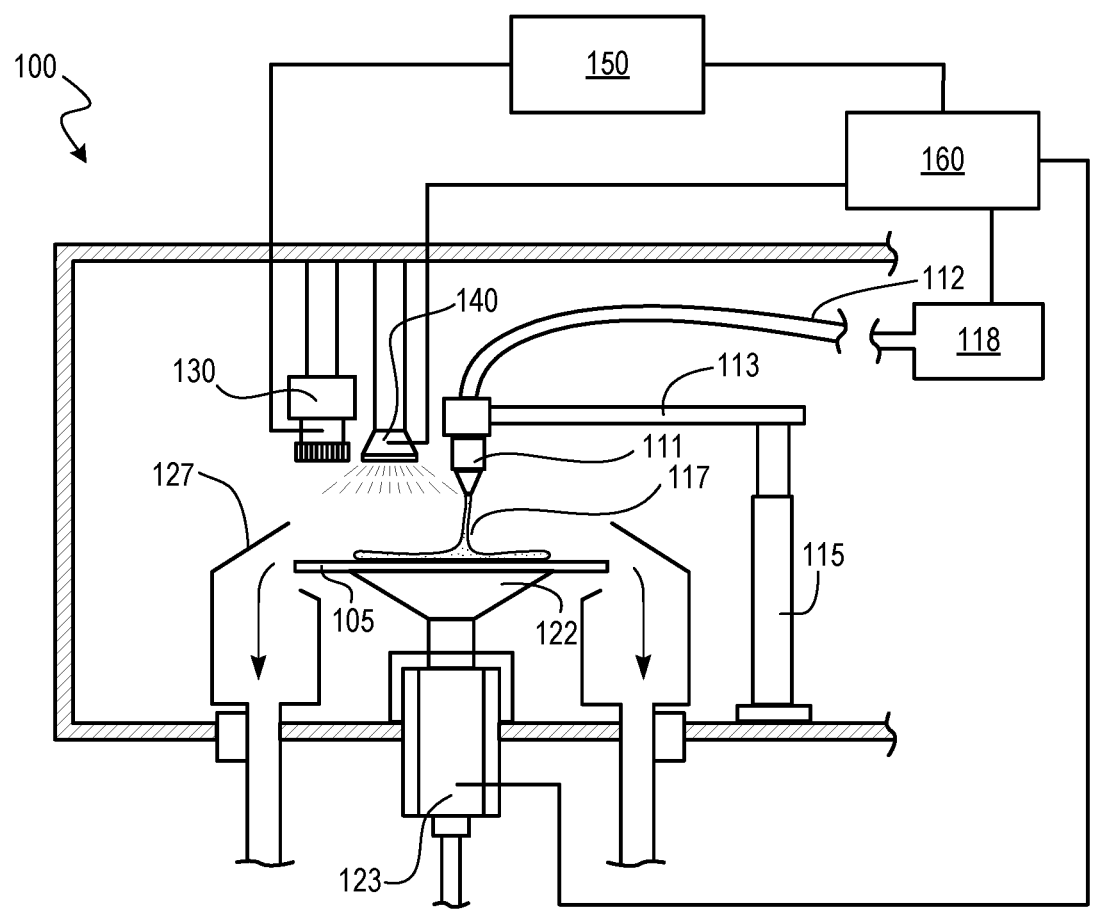
FIG. 1 is a cross-sectional schematic view of an example dispense system according to embodiments disclosed herein.

Techniques herein include systems and methods for dispensing liquids on a substrate with real-time coverage and removal control. Techniques herein are applicable to various manufacturing operations including coating of substrates (such as semiconductor wafers), development of films, wet etching of materials, and cleaning and rinsing of substrates. Various embodiments visually examine stroboscopic images of movement of a given liquid on a working surface of a substrate, and then generate feedback data for modifying a corresponding dispense operation in real-time, such as by increasing or decreasing a dispensed volume of fluid, and/or increasing or decreasing a rotation velocity of the substrate. Visual or graphically examination can be manual or automated.

Although there are various manufacturing operations that involve liquid material dispensed on a rotating substrate, description of example embodiments will primarily focus on coating a substrate for convenience in describing techniques herein. Routine, conventional microfabrication techniques involve photolithography in which a film (photoresist) is coated on a substrate, exposed to a pattern of actinic radiation, and then developed to remove soluble material.

Conventionally, more photoresist is dispensed than what is needed to fully cover a substrate. The extra or overage of resist is dispensed to ensure that the entire substrate is evenly coated. A substrate (typically a semiconductor wafer) is spun at relatively high speed (rotational velocity) while liquid resist is dispensed on to a working surface of the wafer. The spinning wafer then uses centrifugal force to push the resist to the edge of the substrate (typically a circular wafer). A given resist, developer, or other fluid has a line of progression that does not always have a uniform edge. That is, a photoresist does not have an outer edge or outer meniscus that evenly spreads radially, such as a perfect circle evenly expanding. Instead, the outer edge of the photoresist is not uniform and certain areas of the photoresist can reach the edge of the substrate prior to other areas. The result can appear as jagged edges of photoresist at the edge of a substrate. This incomplete coverage is not visible to the human eye while the substrate is rotating. Instead, a rotating substrate can appear to be fully coated when rotated due to blurring of the liquid. When stopped, however, the substrate can be seen to have incomplete coverage.

For many applications a uniform and full coating of photoresist on the working surface of the substrate is required. To meet this requirement, extra resist is dispensed so that the spinning substrate can become fully coated. The extra resist falls off the edge of the wafer and is wasted resist. Conventionally, manufactures may deposit as much as 400% or more extra of photoresist and other liquid chemistry as a factor of safety to account for several different variables that can affect full coverage. One factor is a dispense capability of a dispense system itself. For example, some photoresist compositions can coat a substrate with approximately 0.2 cc of resist. Due to dispense variables, it is common for approximately 0.8 cc of resist to be dispensed.

There are various factors or variables that contribute to the excess fluid that is dispensed. Some factors relate to the capability of the dispense system itself. This includes variability in valve response, conduits, measurement means, et cetera. Another factor is performance of a given photoresist or liquid chemistry. With slight variations in photoresist composition—even within a same chemical formula—a given amount of liquid dispensed can have more or less viscosity at any given dispense. A variation in viscosity needs to be addressed and usually contributes to increasing an amount of safety stock by dispensing more chemistry. Another factor affecting coverage is physical properties of the substrate surface itself. During the fabrication of semiconductor devices on wafers, there are different materials used at different stages of fabrication. Moreover, the surface topography can differ depending on stage of fabrication as well as type of devices being fabricated (for example, memory versus logic). A given material and/or topography can increase viscosity of a photoresist spreading across this surface. Wettability of a substrate is a significant factor because there can be substantial variations in the interaction of a liquid with the substrate. This interaction routinely causes deviation of liquid flow across the substrate. When these factors of safety are compounded, manufactures may then use substantially more chemistry then what is actually needed for full coverage. Some manufacturers can run four times or more extra volume as compared to what is actually needed.

Note that because a given photoresist coating a substrate reaches a substrate edge at different rates, there is typically an amount of safety stock required for complete coverage. This minimum extra photoresist is usually around 2-20% extra. Thus, a given substrate can—by calculation—be fully coated with 102-120% of resist actually needed to be deposited for full coverage. Because of the various performance factors, however, manufacturers routinely deposit 300% to 500% more of photoresist (or developer) than what is actually needed. The extra is just safety stock. It is an amount not required to coat/rinse the substrate, but simply included to make sure a substrate never results in a partial coating.

Techniques herein, however, provide highly accurate control of liquid coverage and progression across a substrate. Each substrate can be characterized by a stroboscopic images, and then the system can use a feedback control loop (such as Advanced Process Control (APC)) to make sure that an exact amount of volume is dispensed, which significantly reduces a volume of safety stock dispensed. Thus, instead of having a safety stock that is 300% or 400% or 500% more than what is needed, the system and methods herein can deposit a photoresist, developer or other liquid with an overage less than 50%, 20% or even 2% extra. Each substrate being processed by liquid deposition can be monitored in real-time with a stroboscope and can map points in time along an edge of a liquid moving across the substrate. This edge can be an outer edge of a liquid coating the substrate, and/or an inner edge of liquid clearing off of the substrate.

Based on analysis of liquid progression or behavior, some actions or modifications to the dispense system can be made. For example, in some dispenses it can be observed that the photoresist progresses relatively quickly and moves over the edge of the substrate for an early coating. With the system optically observing a coating progression and identifying when a coating is complete (or will be complete by identifying rate of progression), the system can indicate (provide feedback) when or at what point a full coat is achieved or will be achieved to cease dispensing a liquid. If the system observes or determines that the edge of the resist is slowing down and moving slowly, then action can be taken to accelerate rotation of the substrate holder and/or dispense additional resist onto the substrate to achieve full coating or wetting.

Conventionally, analysis of coating performance occurs after a coating process. Basically a substrate is stopped from rotation or removed from a processing chamber to inspect coat coverage. To the unaided eye, coating progress may look uniform as non-uniformities are blurred with high-speed rotation. Techniques herein, however, provide a real-time look at a substrate coat's future, as well as the capability of that coat by looking at data from the stroboscope and applying that data as real-time feedback, such as to identify a dispense and/or rotation stopping point. An image processor can be connected to a high speed camera and stroboscope. The image processor can analyze stroboscopic images (video) of a coating application to make adjustments to spin speed and dispense speed/amount. Such controls can adjust to variable process conditions in real-time. Thus, instead of estimating a substrate's wettability and a photoresist's viscosity to calculate a safe dispense amount and spin time, photoresist can be deposited on a rotating substrate without initially knowing a stopping point. As the photoresist spreads across the substrate, the processor viewing this progression—as if the substrate background were motionless—can identify a progression rate as a function of time and then can accurately indicate a stopping point. Accordingly, knowing substrate wettability and photoresist viscosity is not required because the system can stop a given coating operation when a substrate is fully coated. In other words, instead of estimating a stop time and estimating a volume of liquid to be dispensed, a precise dispense volume and stop time can be calculated in real-time based on visual observation of liquid progression. In some embodiments, an initial substrate can have a fluid dispensed thereon, and then stroboscopic images are used to identify a spin and dispense time needed for a full coat. This dispense time and volume data can then be used for subsequent dispenses.

Techniques herein will now be described with respect to the accompanying drawings. Referring to FIG. 1, system 100 is a system for dispensing liquid on a substrate 105. Substrate holder 122 is configured to hold substrate 105 and rotate substrate 105 about an axis. Motor 123 can be used to rotate the substrate holder 122 at a selectable rotational velocity. A dispense unit 118 is configured to dispense liquid on a working surface of the substrate 105 while the substrate 105 is being rotated by the substrate holder 122. Dispense unit 118 can be positioned directly over a substrate holder, or can be positioned at another location. If positioned away from the substrate holder, than a conduit 112 can be used to deliver fluid to the substrate. The fluid can exit through nozzle 111. FIG. 1 illustrates liquid 117 being dispensed onto a working surface of substrate 105. Collection system 127 can then be used to catch or collect excess liquid 117 that spins off substrate 105 during a given dispense operation.

Dispense components can include nozzle arm 113 as well as support member 115, which can be used to move a position of nozzle 111 across the substrate 105, or to be moved away from the substrate holder 122 to a resting location, such as for rest upon completion of dispense operations. The dispense unit 118 can alternatively be embodied as a nozzle itself. Such a nozzle can have one or more valves in communication with system controller 160. The dispense unit 118 can have various embodiments configured to control dispense of a selectable volume of fluid on a substrate.

System 100 includes stroboscope 140 configured to illuminate the working surface of the substrate in phase with substrate rotation. Stroboscope 140 can be used to optically slow down a spinning substrate to evaluate fluid characteristics such as coverage, removal, laminar/turbulent flow, et cetera. Stroboscope 140 can be used to make the substrate appear slow moving or stationary. By activating stroboscope 140 on a rotating substrate, images (video) can be captured to evaluated a dispense operation. When illuminated in phase with substrate rotation, the substrate can appear to be stopped, but liquid 117 can be seen progressing across the substrate surface.

Image capturing device 130 is positioned to capture images of the working surface of the substrate while the substrate is being rotated and illuminated. Image capturing device 130 can be a camera that is pointed at the substrate surface to take pictures. Captured images (a sequence of images/video) can then be used for image-based analysis of fluid progression and behavior. Note that image capturing device 130 can include a single camera or multiple cameras. Cameras can be positioned at various angles relative to the working surface of the substrate, as well as positioned to capture images of a whole of a substrate or be focused on a particular section of the substrate. For example, given cameras can be positioned at different regions of the substrate. A single camera can be positioned to capture images at an edge of the substrate at one location. Multiple cameras can be positioned to capture an entire periphery of the substrate and or central regions. Cameras can be positioned on nozzle arm 113 or other moveable components. As can be appreciated, there are many variations of camera number and positioning depending on evaluation objectives.

Accordingly, video can be captured of an edge of a liquid moving across a spinning substrate while the substrate appears to be stationary. Captured images can be transmitted to, or collected by, processor 150. Processor 150 is configured to examine stroboscopic images received from the image capturing device of a first liquid on the working surface of the substrate. The processor is configured to generate feedback data while the substrate is rotating with the first liquid thereon. With the substrate made to appear stationary, an edge of a liquid can be seen very clearly progressing across the substrate surface. By analyzing the video, the processor can determine how complete edge propagation of fluid is, or determine de-wetting conditions among other things. This edge progression data can then be fed to system controller 160. System controller 160 is connected to the substrate holder 122 and connected to the dispense unit 118. The system controller 160 is configured to adjust a volume of the liquid dispensed onto the working surface of the substrate based on the feedback data while the substrate is rotating with the first liquid thereon. For example, a purpose-built or an APC control loop or feedback control loop connected to the system controller 160 is arranged to control a corresponding dispense system and/or substrate spinning mechanism.

The dispense unit 118 can be embodied using various technologies. Various valves, flow controllers, filters, nozzles, et cetera can be used. The various dispense technology selected for use can provide various levels of volume control and delay. Techniques here can benefit from precise volume control by using a bladder-based dispense unit such what is described in US Patent Application Publication No. 2018/0046082 (U.S. Ser. No. 15/675,376) entitled "High-Purity Dispense Unit." Such a precise dispense system, however, is not required. Accordingly, techniques can be practiced herein with conventional dispense systems.

With a high degree of accuracy, edges of liquid can be tracked. This can help identify areas of insufficient coverage (sometimes termed "mouse bite" occurrences) or other non-uniform edge progression to make sure a substrate is fully covered. For example, with respect to photoresist deposition to cover a substrate, a non-covered formation can occur at the edge of the photoresist progression. This non-covered area and its formation can then be tracked as a function of time prior to formation. Such tracking can help ensure a complete coat and minimize excess liquid material. By tracking the leading edge of photoresist propagation as it is moving over the edge of the substrate, this progression can be tracked as a function of time during photoresist spinning. The processor can then calculate a location of that function of time and then determine where the photoresist edge is and how close a given edge is to actually having a mouse bite occur. Identifying uncoated portions can then automatically trigger a response such as depositing incrementally more photoresist or accelerating a rotational velocity to achieve full coverage. Such edge tracking can also be used to calculate a rate of progression in real time. The rate of progression can be used to identify or calculate when the photoresist fully covers (or will fully cover) the substrate and thus this coverage rate can be used to indicate when to stop dispensing photoresist on the substrate.

Because of non-uniform propagation of liquid chemistry, a certain amount of liquid overage is needed to fully cover a given substrate. With accurate control, however, this overage can be as low as 2-50% extra material dispensed.

Figure 2:
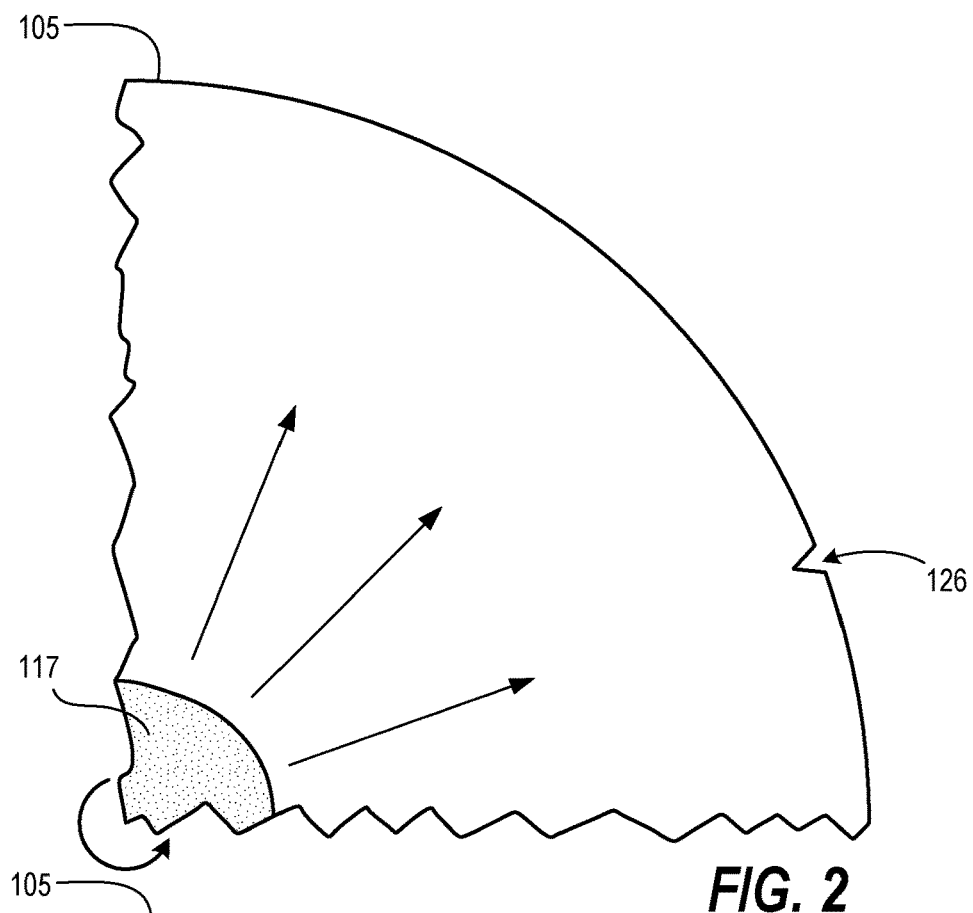
FIG. 2 is a top view of an example substrate segment showing flow of an example coating process according to embodiments disclosed herein.

FIG. 2 illustrates a top view of a substrate segment showing a working surface of the substrate 105. The substrate 105 is being rotated at a relatively high speed, such as tens of thousands of revolutions per minute. It is common for semiconductor wafers to have a notch 126 or straight edge, at one location of the substrate. Sometimes this notch 126 is V-shaped, while other times it is a short, flat edge of an otherwise circular wafer. Using notch 126 is one example technique of how to phase lock a stroboscope for generation of stroboscopic images.

Note that using a stroboscope is an optional embodiment for generating stroboscopic images. In other embodiments, a high-speed camera can be used that is configured to only capture images in phase with substrate rotation, such as when notch 126 appears at a same location. An alternative technique is software processing of recorded video. In this technique, the processor first analyzes a sequence of images and identifies images in which the substrate is at a particular position. For example, the software can look for images in which the notch is at a specific coordinate location. Then images matching this criteria are selected (copied or extracted) and sequenced so that video generated by specific image selection generates video of the substrate appearing to be stationary while liquid thereon appears to be moving. Thus, there are several techniques available for generating stroboscopic images.

Figure 3:
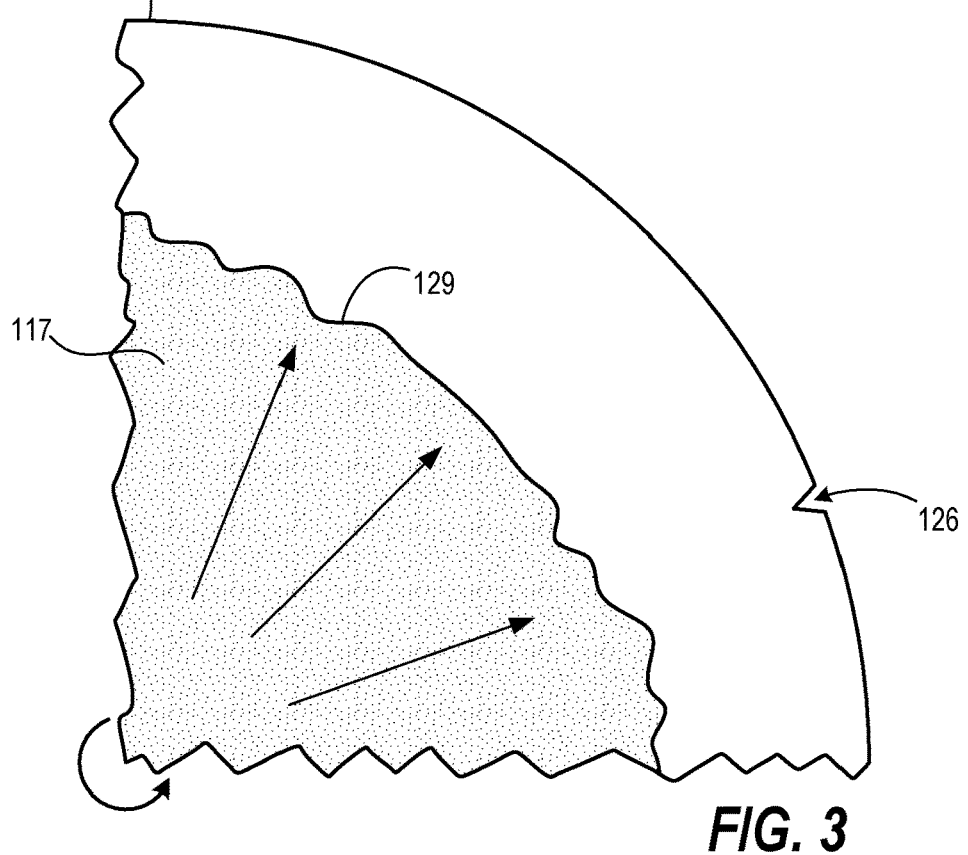
FIG. 3 is a top view of an example substrate segment showing flow of an example coating process according to embodiments disclosed herein.
Figure 4:
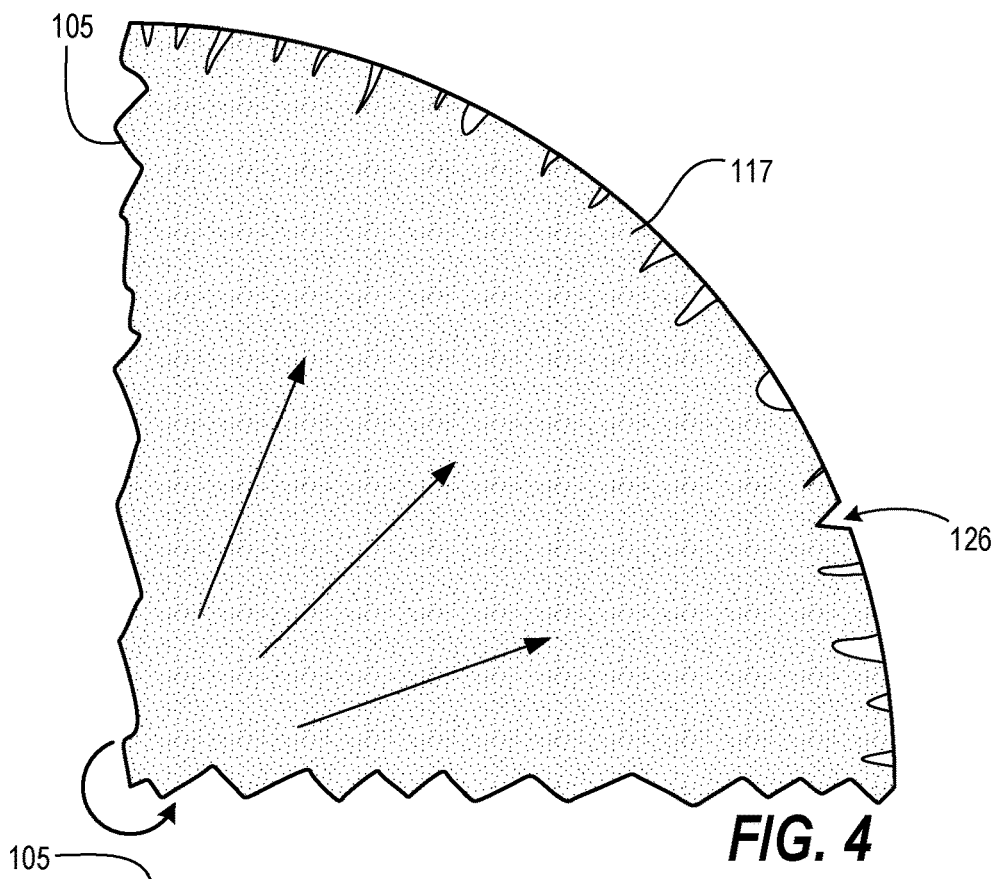
FIG. 4 is a top view of an example substrate segment showing flow of an example coating process according to embodiments disclosed herein.
Figure 5:
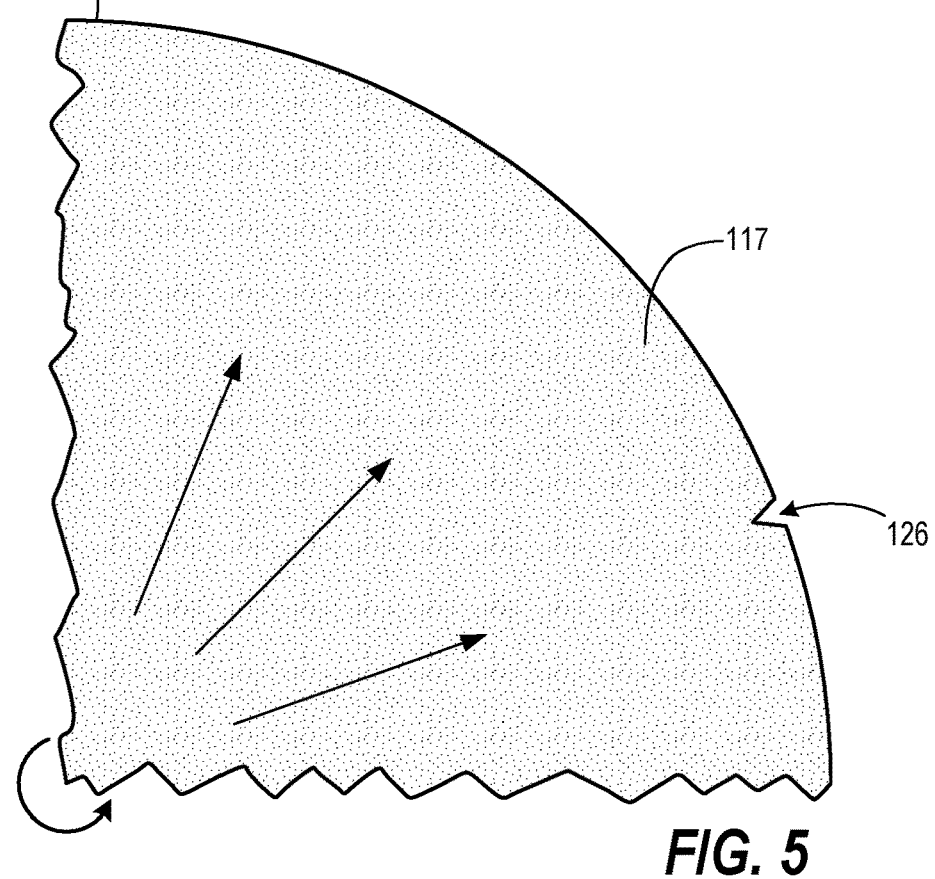
FIG. 5 is a top view of an example substrate segment showing flow of an example coating process according to embodiments disclosed herein.

In FIG. 2, liquid 117 is shown on a working surface of substrate 105. This can be, for example, a photoresist that is deposited at or near a center point of the substrate 105. As substrate 105 is rotated at high-speed, liquid 117 spreads radially. FIG. 3 illustrates continued radial progression of liquid 117. Note that outer meniscus 129 has a non-uniform edge. In other words, when viewed as stroboscopic images it can be seen that liquid 117 does not spread evenly or perfectly evenly. FIG. 4 shows progression of liquid 117 after portions of liquid 117 have reached an outer edge of the substrate. Note that there are several regions of slivers (mouse bites) that are not yet covered with liquid 117. If a coating operation were stopped at this point then there would be insufficient coverage. By examining the stroboscopic images, however, it can be determined how to complete coating coverage. This can include merely continuing to spin the substrate if resist is still spreading out. Other actions can include increasing a rotational velocity of the substrate, or depositing more liquid on the substrate. Because an aggregate surface area of non-covered regions can be accurately calculated or estimated based on evaluation of stroboscopic images, an additional volume to be dispensed can be accurately determined. The system controller can then receive this feedback or instructions from the processor and then control the dispense unit to dispense an additional incremental volume sufficient to complete full coating coverage with a minimum additional volume dispensed. A result is illustrated in FIG. 5. Accordingly, a given substrate can be fully coated with a minimum amount of extra resist dispensed.

As can be appreciated, embodiments herein are not limited to coating a photoresist on a wafer, but can apply to many additional microfabrication techniques using liquid deposited on a rotating substrate. For example, stroboscopic analysis herein can benefit developer dispenses. After a layer of photoresist has been exposed to patterned actinic radiation, soluble portions need to be developed. For film development, the objective is not merely to coat a substrate, but to dissolve and fully remove soluble material. With development, a greater volume of fluid is typically dispensed as compared to photoresist. The substrate can be visually monitored by analyzing stroboscopic images. Visual changes can indicate a completed dissolution of soluble material, flow dynamics, and so forth.

Techniques herein can benefit development with different developers including negative-tone developers. In practice it is common for approximately 6-8 ccs of negative-tone developer is dispensed, while around 30-50 ccs of other developers may be dispensed. Regardless of the developer used, de-wetting can be an issue during development, especially on the edge of the wafer. Development is slower than photoresist deposition. During development, solute can be picked up resulting in a weak photoresist solution. This solution can move along scribe lanes faster than across other areas. If the solution becomes saturated then photoresist can be deposited on the substrate again causing defects. Also, if the developer solution dries in one area before dissolved photoresist is carried off the substrate, then that photoresist can be re-deposited on the substrate. Thus, techniques herein can monitor clearing off of the developer from the substrate. Both the leading edge and trailing etch can be monitored. If gas is also used in clearing a wafer than an air jet interaction of the trailing edge (nitrogen puff) can be monitored in real time.

These techniques and monitoring can similarly apply to wet etching. Optical or image monitoring of fluids of the substrate can be used to make sure the dispense and constants of a developer are not changing due to a condition of surfactants changing. Etch rates and developer consumptions can be identified via pattern recognition of stroboscopic images. By using image analysis to identify particular conditions (completed, turbulent), the dispense system can take corresponding actions such as to stop dispensing developer/etchant, or to slow rotational velocity in response to turbulent conditions. Minimizing an amount of developer or etchant used can reduce overall waste to benefit green processing initiatives. Certain developers can be expensive and so minimizing a volume dispensed is economically beneficial as well.

Embodiments herein similarly apply to cleans and rinses. Various rinse or clean operations can use piranha, SC1, SC2, deionized water, et cetera. Knowing a rinse or cleaning progression can have benefits including yield and throughput. Some rinsing liquids, such as deionized water, are relatively economical compared to resists and developers, and thus using substantially more than is needed may not have a large environmental or materials cost. But yield and throughput can benefit from real-time feedback. By knowing a precise completion point, rinses and etches can be stopped earlier compared to conventional techniques that need to run a safety stock or spin time to make sure a given substrate is fully cleaned or etched. Regarding defect reduction, some structures being micro-fabricated can be relatively delicate at certain stages. If a rinse liquid goes from laminar flow to turbulent flow, then this turbulent flow has the potential to damage or destroy structures being created. Thus monitoring for turbulent conditions can improve yield. Throughput can be increased by knowing exactly when a rinse or clean is completed. If a given rinse or clean process is completed and then immediately stopped based on analysis of stroboscopic feedback, then a number of wafers processed per hour can be increased. For some rinse operations, the system can be embodied to have an array of nozzles such as to spray liquid on the substrate.

Figure 6:
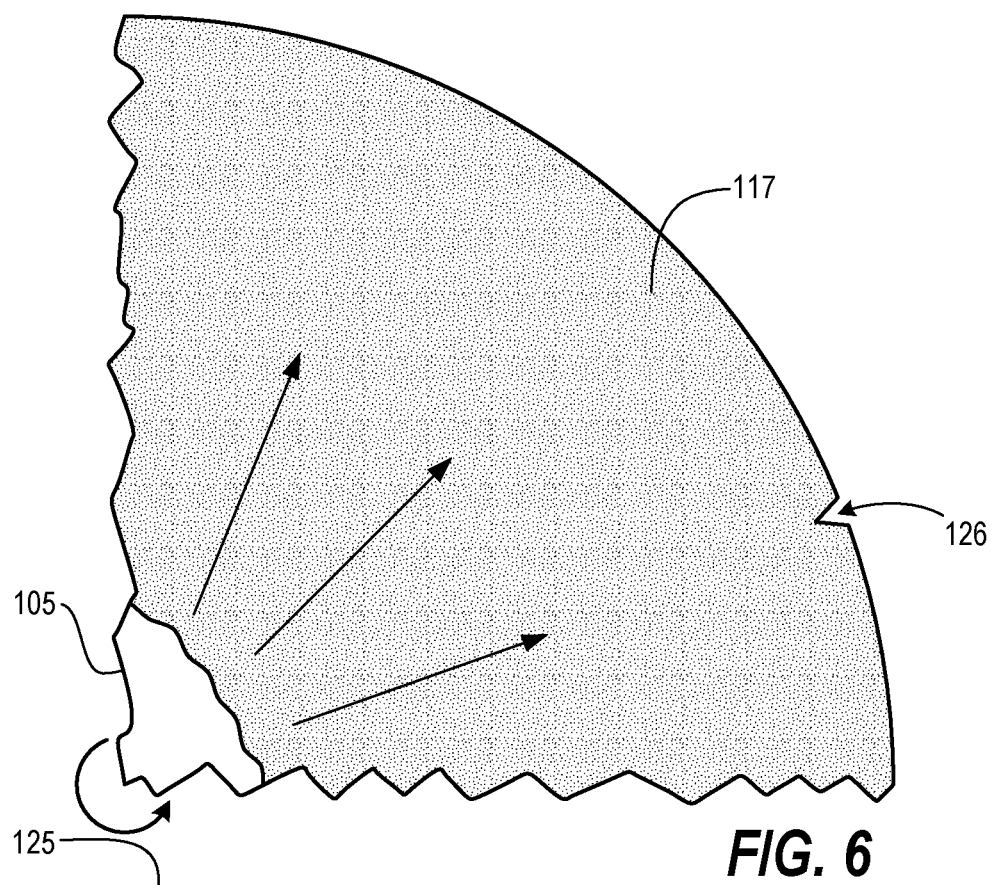
FIG. 6 is a top view of an example substrate segment showing flow of an example removal process according to embodiments disclosed herein.
Figure 7:
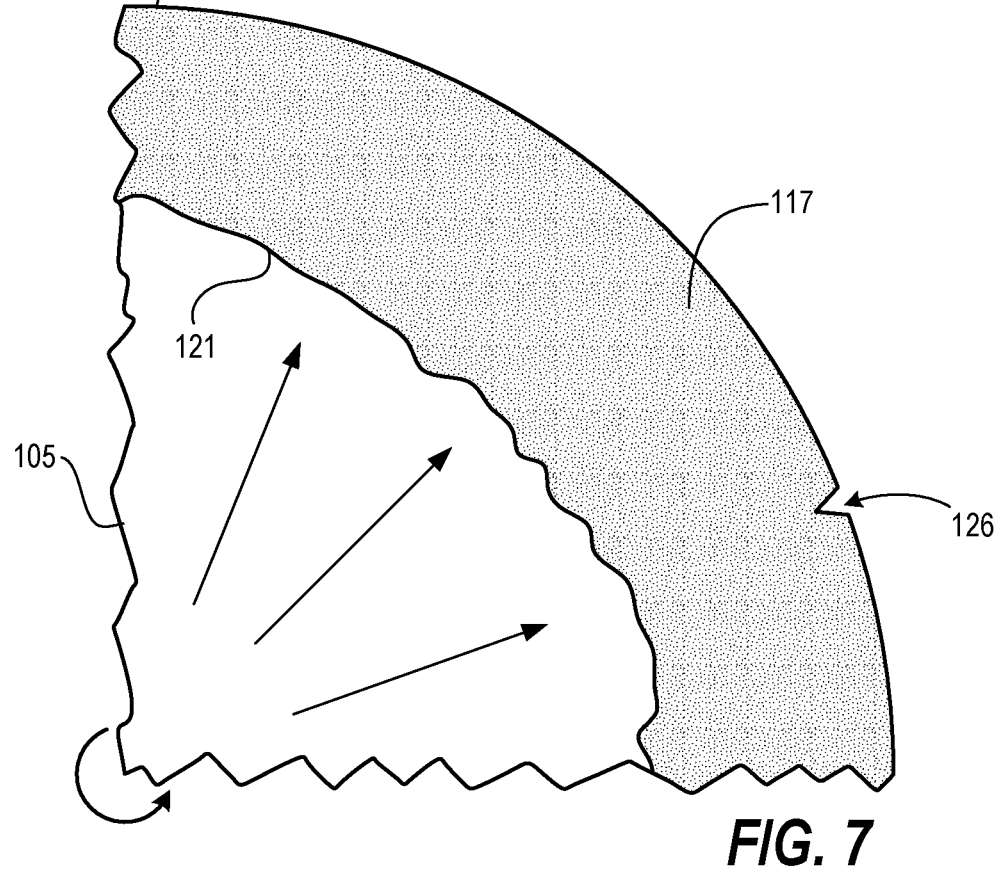
FIG. 7 is a top view of an example substrate segment showing flow of an example removal process according to embodiments disclosed herein.
Figure 8:
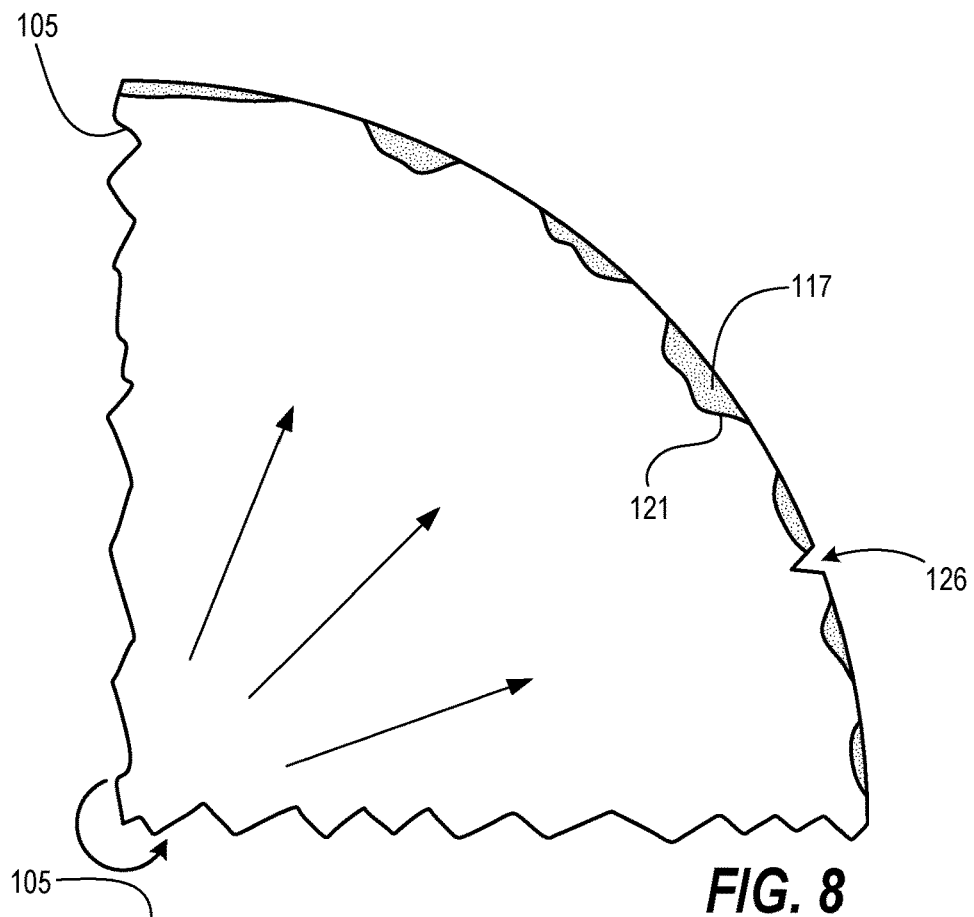
FIG. 8 is a top view of an example substrate segment showing flow of an example removal process according to embodiments disclosed herein.
Figure 9:
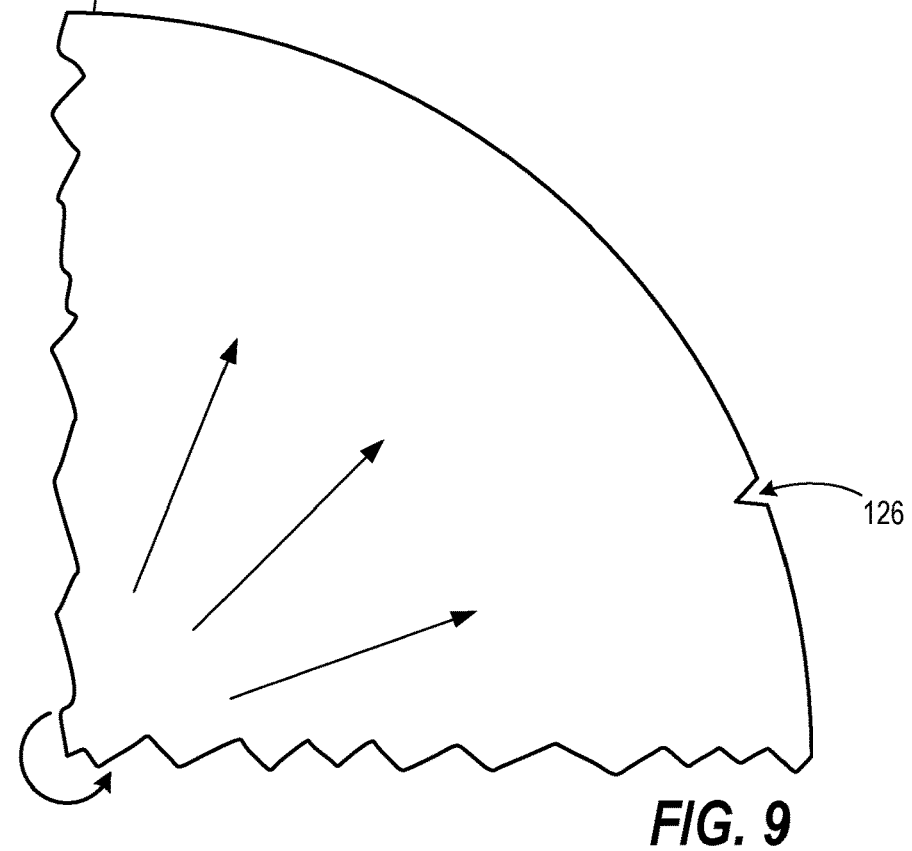
FIG. 9 is a top view of an example substrate segment showing flow of an example removal process according to embodiments disclosed herein.

FIGS. 6-9 illustrate an example development, etch, or rinse operation. In FIG. 6, liquid 117 has been stopped from being dispensed. As a rinse or developer, this fluid continues moving radially to the edge of the substrate 105. This can result in an inner meniscus 121 moving outwardly (FIG. 7). This inner meniscus 121 can be monitored such as to look for an undesirable flow condition that might damage devices thereon. If such a condition is identified, then the controller can reduce a rotational velocity. In FIG. 8 it can be identified that almost all liquid 117 has been spun off. The processor can calculate or identify when liquid 117 is indeed all off of the substrate (FIG. 9), and in response stop the corresponding dispense operation. Other operations can be executed. For example, if stroboscopic image analysis shows re-deposition of material, then more liquid can be dispensed to dissolve/remove such material.

Accordingly, real-time control can be provided for accurate coating, development, etching, rinsing, and cleaning.

Another embodiment includes a quality control system and quality control method for spin-on dispense systems. This quality control method can be used in all spin-on dispense applications (coating, deposition, development, rinsing, etching, et cetera). In such a method, stroboscopic images across multiple wafers can be concatenated for analysis and identification of any defects or problems. Basically, several images can be stitched together for viewing and analysis. With such a technique, instead of creating a video of a single wafer showing liquid movement, other types of video can be created including static images. For example, images from multiple wafers that have been processed can be collected. These sample images can all be from a same process time or point of liquid progression. The result can be an essentially static video with movement only seen when deviations occur.

Figure 10A:
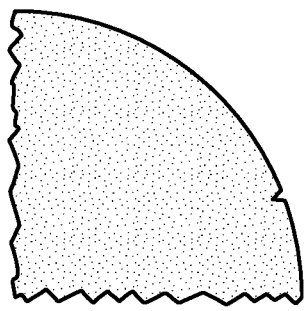
FIGS. 10A-10I are top views of sample images across multiple substrates at a particular point in processing.
Figure 10B:
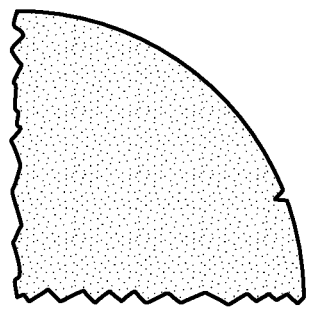
Figure 10C:
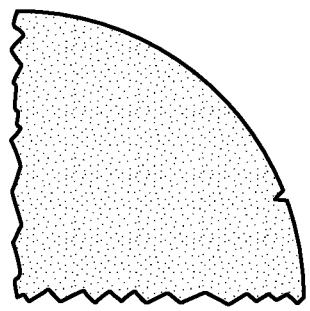
Figure 10D:
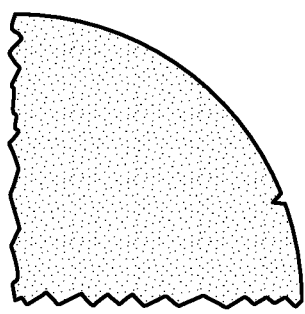
Figure 10E:
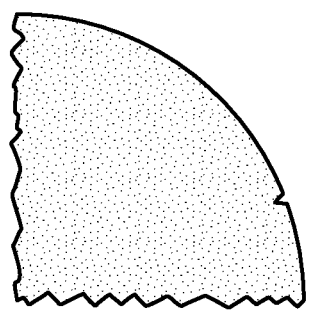
Figure 10F:
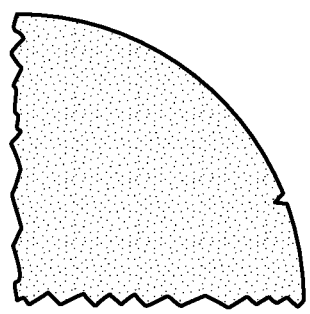
Figure 10G:
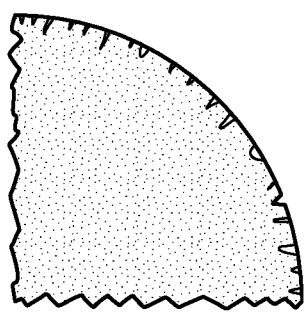
Figure 10H:
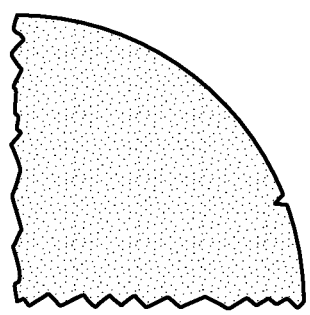
Figure 10I:
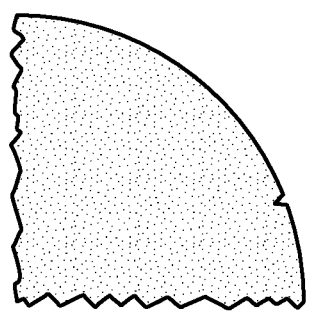

Referring to FIGS. 10A-10I, an example of such static analysis is illustrated. Each drawing of FIGS. 10A-10I represents a different substrate at a particular point in time of processing. This can be for a given recipe, resist, or for different recipes and different resists, et cetera. Note that all of FIGS. 10A, 10B, 10C, 10D, 10E, 10F, 10H, and 10I appear identical, while FIG. 10G is different in that the particular substrate of FIG. 10G is not fully coated. Viewing a video of all these images sequenced together can show a difference when FIG. 10G is displayed. The difference in FIG. 10G can represent various different conditions. It could be that a same resist flows more slowly over the substrate of FIG. 10G as compared to other substrates suggesting higher viscosity for that particular substrate. Another conclusion could be that different resists were used and a particular resist of FIG. 10G flowed slower than other resists. Such information can be valuable for quality control of recipes, fluid compositions, and lot-to-lot variations of substrate processing.

With compiled sample images across many wafers, it becomes possible to quickly zero in on or identify differences between hundreds of recipes or hundreds of wafers. Moreover, as substrates are continually processed, more images can be added to a given sequence to increase a density of images. Sample images can show all, edge, or interior portions of sampled wafers. Other image sequences can be created by adjusting opacity of sampled images, overlaying those images on each other, and creating a video sequence to see motion of different dispenses or resists during liquid progression. Instead of overlaying partially-transparent images across substrates, images from multiple different wafers can be combined side-by-side so that progression of different resists and/or progression across different wafers can be simultaneously viewed. Side-by-side comparison can also be realized by combining pie slice-shaped images next to each other to appear as a single substrate with angular sections showing progression of different liquids.

For example, in one embodiment, stroboscopic images of a plurality of substrates can be obtained. The stroboscopic images show fluid on a working surface of each substrate. The fluid has been dispensed onto each substrate during rotation of the substrate. A first set of sample images is identified that includes a sample image for each substrate of the plurality of substrates. The first set of sample images is combined into a video (image sequence). The video is then displayed or otherwise graphically analyzed. The video shows stroboscopic images across the plurality of substrates.

Note that with any of the techniques herein, analysis of images can be executed by human eye and/or with automated graphical image analysis programs. Speed of image sequences can be adjusted depending on who or what is performing a given analysis. Image sequences captured or compiled are not limited to a phase lock of a flash, but can instead be out-of-phase. Out-of-phase image sequences can be configured to make liquid appear to be going backwards or provide a slow-motion effect. Such variations can be useful for different types of analyses. Image sequences can be created at any frame rate for post processing. For real time processing a capture frame rate can be used. In other embodiments, for out-of-phase image capturing, images can be captured at different rotational angles such as 90 degrees and zero degrees. Images can be incrementally captured from degree to degree also. Thus sequences of incrementally moving substrates can be created at different angles instead of at a same point on the wafer.

One embodiment includes a system for dispensing liquid on a substrate. The system includes a substrate holder configured to hold a substrate and rotate the substrate about an axis. A dispense unit is configured to dispense liquid on a working surface of the substrate while the substrate is being rotated on the substrate holder. A stroboscope is positioned and configured to illuminate the working surface of the substrate by repeatedly flashing light. The stroboscope can be configured to illuminate the working surface of the substrate in phase with substrate rotation.

A camera is positioned to capture images of the working surface of the substrate while the substrate is being rotated and illuminated. A processor is connected to, or accessible by, the system and is configured to examine stroboscopic images received from the camera of a first liquid on the working surface of the substrate. The processor is configured to generate feedback data while the substrate is rotating with the first liquid thereon. Feedback data can also be generated and provided after dispense operations. The processor, based on examination of stroboscopic images of movement of the first liquid, can also be configured to monitor a coating progression of photoresist across the working surface of the substrate and generate the feedback data indicating when sufficient photoresist has been dispensed for full coverage of the working surface of the substrate. This indication can be anticipatory based on a progression rate.

A system controller is connected to the substrate holder and connected to the dispense unit. The system controller is configured to adjust a volume of the first liquid dispensed onto the working surface of the substrate based on the feedback data while the substrate is rotating with the first liquid thereon. The system controller can be further configured to adjust a rotational velocity of the substrate holder based on the feedback data.

The system controller is configured to dispense an initial volume of the first liquid on the working surface of the substrate, and then dispense an additional volume of the first liquid on the working surface of the substrate. The additional volume of the first liquid being sufficient to complete full coverage of the first liquid on the working surface of the substrate. In other words, more fluid can be dispensed when it is determined that more is needed to fully cover a wafer.

The system controller is configured to increase a rotational velocity of the substrate holder based on the feedback data indicating insufficient coverage of the first liquid on the working surface of the substrate. Such an increase in rotational velocity can help to spread a film across the substrate. The system controller can alternatively decrease a rotational velocity of the substrate holder based on the feedback data that indicates, for example, a turbulent condition of the first liquid on the working surface of the substrate or excess resist being flung from the substrate. The system controller can increase the volume of the first liquid dispensed on the working surface of the substrate based on the feedback data indicating insufficient coverage of the first liquid on the working surface of the substrate.

Another embodiment includes a system with a substrate holder configured to hold a substrate and rotate the substrate (such as a semiconductor wafer) about an axis. A dispense unit is configured to dispense liquid on a working surface of the substrate. The dispense unit can include a dispense nozzle removably positioned above the working surface of the substrate. A camera is positioned to capture images of the working surface of the substrate. In some embodiments, the camera can have a shutter speed sufficient to capture at least 69 frames per second. A processor is configured to examine stroboscopic images of movement of a first liquid on the working surface of the substrate and generate feedback data. A system controller is connected to the substrate holder and connected to the dispense unit. The system controller is configured to adjust a given dispense operation of the first liquid on the working surface of the substrate based on the feedback data corresponding to the given dispense operation. The system can include a stroboscopic image generation system configured to generate stroboscopic images of the working surface of the substrate during substrate rotation. Also, multiple cameras can be positioned to capture images of different regions of the working surface of the substrate.

The processor can have many functions. The processor can be configured to generate the feedback data while the substrate is rotating with the first liquid thereon, and a given dispense operation can be adjusted while the substrate is rotating with the first liquid thereon. Based on examination of the stroboscopic images of movement of the first liquid, the processor can monitor progression of an outer meniscus of the first liquid as the first liquid coats the working surface of the substrate. The processor can also monitor progression of an inner meniscus of the first liquid as the first liquid is spun off the working surface of the substrate. Coating progression of the first liquid can be monitored to generate the feedback data indicating more or less volume of the first liquid to be dispensed to result in a minimum volume dispensed that results in the working surface of the substrate being fully coated and/or identify when the working surface of the substrate is fully covered.

The system controller can be configured to take various actions. For example, the system controller can adjust a volume of the first liquid dispensed onto the working surface of the substrate based on the feedback data while the substrate is rotating. A rotational velocity of the substrate holder can be adjusted based on the feedback data. Based on examination of the stroboscopic images of movement of the first liquid, a volume of the first liquid dispensed can be less than 150 percent of a coverage volume needed to fully cover the working surface of the substrate. The controller can decrease a rotational velocity of the substrate holder based on the feedback data indicating a turbulent conditional of the first liquid on the working surface of the substrate, which can prevent substrate damage. The controller can also stop dispensing fluid in response to receiving the feedback data indicating that the working surface of the substrate is fully covered.

In yet another embodiment, a system for dispensing liquid on a substrate has several features. A substrate holder is configured to hold a substrate and rotate the substrate about an axis. A dispense unit is configured to dispense liquid on a working surface of the substrate while the substrate is being rotated on the substrate holder. A stroboscope is configured to illuminate the working surface of the substrate with repeated flashes of light. An image capturing device is positioned to capture images of liquid progression across the working surface of the substrate. A processor is configured to examine stroboscopic images of movement of a first liquid on the working surface of the substrate and generate feedback data while the substrate is rotating with the first liquid thereon. A system controller is connected to the substrate holder and connected to the dispense unit. The system controller is configured to adjust a given dispense operation of the first liquid on the working surface of the substrate in real-time based on the feedback data corresponding to the given dispense operation.

The system controller can adjust a volume of the first liquid dispensed onto the working surface of the substrate based on the feedback data while the substrate is rotating. An additional volume of the first liquid can be dispensed on the working surface of the substrate, and this additional volume of the first liquid is sufficient to complete full coverage of the first liquid on the substrate. A rotational velocity of the substrate holder can be adjusted based on the feedback data. Increasing rotational velocity of the substrate holder can be based on the feedback data indicating insufficient coverage of the first liquid on the working surface of the substrate. Decreasing the rotational velocity of the substrate holder can be based on the feedback data indicating a turbulent condition of the first liquid on the working surface of the substrate. The system controller can adjust both volume of fluid being dispensed and rotational velocity of the substrate holder based on the feedback data.

The stroboscope can be configured to illuminate the working surface of the substrate in phase with substrate rotation and/or illuminate the working surface of the substrate at a predetermined frequency. The dispense unit can be configured to dispense selective amounts of photoresist, negative tone developer, or other liquid on the substrate based on input from the system controller. The dispense unit can include a dispense nozzle positioned above the working surface of the substrate.

A coating progression of an initial volume of the first liquid on the working surface of the substrate can be monitored by the processor, and the generate the feedback data indicating insufficient coverage of the working surface of the substrate. Based on examination of the stroboscopic images of movement of the first liquid, the processor can calculate a total volume of the first liquid dispensed on the substrate to cover the substrate with less than fifty percent excess volume. The processor can also monitor and generate the feedback data indicating a de-wetting condition, and when sufficient photoresist has been dispensed for full coverage of the substrate. In response to receiving the feedback data indicating when sufficient photoresist has been dispensed for full coverage of the substrate, the controller can stop a dispense operation. Stroboscopic images of movement of the first liquid can also be analyzed to monitor progression of an outer meniscus of the first liquid as the first liquid coats the substrate, or an inner meniscus of the first liquid as the first liquid is spun off the substrate.

Another embodiment herein is a method for dispensing liquid on a substrate. A substrate is rotated on a substrate holder about an axis. A first liquid is dispensed on a working surface of the substrate. Images are captured of the working surface of the substrate while the first liquid is on the working surface of the substrate. Stroboscopic images of movement of the first liquid on the working surface of the substrate are examined using an image processor or manually. Feedback data is generated based on examination of the stroboscopic images while the substrate is being rotated. A dispense operation of the first liquid on the working surface of the substrate is adjusted based on the feedback data. The dispense operation corresponds to examined stroboscopic images.

Adjusting the dispense operation can include selectively modifying a volume of first liquid dispensed on the working surface of the substrate. Adjusting the dispense operation can include selectively modifying a rotational velocity of the substrate holder. Examining stroboscopic images can include identifying coverage progression of photoresist across a semiconductor wafer. Adjusting the dispense operation of the first liquid on the working surface of the substrate can include dispensing an additional volume that is minimized to an amount sufficient to complete full coating coverage of the working surface of the substrate.

Identifying coverage progression of the photoresist across the semiconductor wafer can include calculating a surface area of uncoated regions of the working surface of the substrate. Generating the feedback data can include indicating the additional volume of the first liquid to be dispensed to complete coating coverage of the working surface of the substrate.

Examining stroboscopic images can include identifying coverage progression of photoresist across a semiconductor wafer, and adjusting the dispense operation of the first liquid on the working surface of the substrate can include increasing a rotation velocity of the substrate sufficient to complete full coating coverage of the working surface of the substrate. Alternatively, adjusting the dispense operation of the first liquid on the working surface of the substrate can include reducing a rotation velocity of the substrate sufficient to complete full coating coverage of the working surface of the substrate.

Examining stroboscopic images can include identifying coverage progression of photoresist across a semiconductor wafer. Adjusting the dispense operation of the first liquid on the working surface of the substrate can include dispensing an additional volume sufficient to complete full coating coverage of the working surface of the substrate with an overage volume of photoresist dispensed being less than four percent of a given volume required to fully coat the working surface of the substrate.

Examining stroboscopic images can include identifying coverage progression rate of photoresist across a semiconductor wafer. Adjusting the dispense operation of the first liquid on the working surface of the substrate can include reducing a dispensed volume of the first liquid to a minimum volume sufficient to complete full coating coverage of the working surface of the substrate. Examining stroboscopic images can include examining real time progression of the first liquid across the working surface of the substrate. Adjusting the given dispense operation can occur in real-time.

Examining stroboscopic images of movement of the first liquid and generating the feedback data can occur in real time relative to the given dispense operation. Adjusting the dispense operation of the first liquid on the working surface of the substrate can include stopping the given dispense operation in response to receiving the feedback data indicating that the working surface of the substrate is fully covered with the first liquid. Examining stroboscopic images can include identifying coverage progression rate of photoresist across a semiconductor wafer. Adjusting the dispense operation of the first liquid on the working surface of the substrate can include reducing a dispensed volume of the first liquid relative to an initial volume set to provide full coverage.

Examining stroboscopic images can include examining progression of a developer across the working surface of the substrate and identifying a completion point of a development operation. Adjusting the given dispense operation of the first liquid on the working surface of the substrate can include stopping the given dispense operation in response to receiving the feedback data indicating that material on the working surface of the substrate is fully developed. Examining stroboscopic images can include monitoring fluid progression of the first liquid on the working surface of the substrate and, in response to identifying a turbulent flow condition, generating the feedback data identifying the turbulent flow condition.

Adjusting the given dispense operation can include slowing a rotational velocity of the substrate to reduce the turbulent flow condition. Examining stroboscopic images can include monitoring a rinse operation that uses the first liquid on the working surface of the substrate. The dispense operation can be stopped after receiving the feedback data indicating completion of a rinse condition. Capturing images of the working surface of the substrate can include capturing stroboscopic images of the working surface of the substrate as a stroboscope illuminates the working surface of the substrate in phase with substrate rotation.

In another embodiment, a method for dispensing liquid on a substrate includes multiple steps. A substrate is rotated on a substrate holder about an axis. A first liquid is dispensed on a working surface of the substrate while the substrate is being rotated on the substrate holder. The working surface of the substrate is illuminated in phase with substrate rotation. Stroboscopic images of the working surface of the substrate are captured while the first liquid is on the working surface of the substrate. Stroboscopic images of movement of the first liquid on the working surface of the substrate are examined using an image processor. Feedback data is generated based on examination of the stroboscopic images while the substrate is being rotated. A dispense operation of the first liquid on the working surface of the substrate is adjusted in real-time based on the feedback data. The dispense operation corresponds to examined stroboscopic images.

An amount of the first liquid dispensed onto the working surface of the substrate can be increased based on progression of the first liquid across the working surface of the substrate as indicated by the feedback data. An amount of the first liquid dispensed onto the working surface of the substrate can be adjusted based on progression of the first liquid across the working surface of the substrate as indicated by the feedback data. A rotational speed of the substrate can be increased or decreased based on progression of the first liquid across the working surface of the substrate as indicated by the feedback data. An outer meniscus or inner meniscus of the first liquid can be tracked and monitored across the working surface of the substrate to identify a predetermined condition.

Examining the stroboscopic images can include identifying a coating progression of the first liquid across the working surface of the substrate. Generating the feedback data can include generating the feedback data indicating insufficient coverage of the working surface of the substrate.

In yet another embodiment, a method of quality control is disclosed. Stroboscopic images are obtained of a plurality of substrates. The stroboscopic images show a first liquid on a working surface of each substrate. The first liquid has been dispensed onto the working surface of each substrate during rotation of each substrate. A first set of sample stroboscopic images is identified that includes a given stroboscopic image for substrates of the plurality of substrates. Sample stroboscopic images are compiled from the first set of sample stroboscopic images into a video. The video is displayed, which shows stroboscopic images across the plurality of substrates.

The given stroboscopic image for substrates of the plurality of substrates can represent a same point in time in processing of respective substrates. Deviations in process can be identified by visually identifying image changes in the video. Additional sample stroboscopic images can be added to the video after obtaining the additional sample stroboscopic images. The sample stroboscopic images can show photoresist near an edge of respective substrates. The substrates can include semiconductor wafers and wherein the first liquid is photoresist.

Another embodiment includes a method of quality control. The method
Includes obtaining stroboscopic images of a plurality of substrates. The stroboscopic images show a first liquid on a working surface of each substrate. The first liquid has been dispensed onto respective substrates during rotation of the substrates. The method includes identifying a first set of sample stroboscopic images that include a sample stroboscopic image for substrates of the plurality of substrates. Sample stroboscopic images are compiled from the first set of sample stroboscopic images into a collection of stroboscopic images. The collection of stroboscopic images is analyzed by comparing stroboscopic images in the collection of stroboscopic images to each other. Analyzing the collection of stroboscopic images can include identifying deviations in performance by identifying differences in the stroboscopic images that indicate differences in coverage of the first liquid.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of quality control, the method comprising:
obtaining stroboscopic images of a plurality of substrates, the stroboscopic images showing a first liquid on a working surface of each substrate, the first liquid having been dispensed onto the working surface of each substrate during rotation of each substrate;
identifying a first set of sample stroboscopic images that includes a given stroboscopic image for substrates of the plurality of substrates;
compiling sample stroboscopic images from the first set of sample stroboscopic images into a video; and
displaying the video, the video showing stroboscopic images across the plurality of substrates.

2. The method of claim 1, wherein the given stroboscopic image for substrates of the plurality of substrates represents a same point in time in processing of respective substrates.

3. The method of claim 1, further comprising:
identifying deviations in process by visually identifying image changes in the video.

4. The method of claim 1, further comprising:
adding additional sample stroboscopic images to the video after obtaining the additional sample stroboscopic images.

5. The method of claim 1, wherein the sample stroboscopic images show photoresist near an edge of respective substrates.

6. The method of claim 1, wherein the substrates include semiconductor wafers and wherein the first liquid is photoresist.

* * * * *